United States Patent [19]

Yamanobe et al.

[11] Patent Number: 5,470,527
[45] Date of Patent: Nov. 28, 1995

[54] TI-W SPUTTERING TARGET AND METHOD FOR MANUFACTURING SAME

[75] Inventors: Takashi Yamanobe; Michio Satou; Takashi Ishigami, all of Kanagawa; Minoru Obata, Tokyo; Mituo Kawai, Kanagawa; Noriaki Yagi, Kanagawa; Toshihiro Maki, Kanagawa; Shigeru Ando, Kanagawa, all of Japan

[73] Assignee: Kabushiki Kaisha Toshiba, Kanagawa, Japan

[21] Appl. No.: 302,996

[22] Filed: Sep. 12, 1994

Related U.S. Application Data

[62] Division of Ser. No. 49,409, Apr. 20, 1993, abandoned.

[30] Foreign Application Priority Data

Apr. 21, 1992  [JP]  Japan ..................... 4-101427

[51] Int. Cl.$^6$ ..................................... B22F 3/10
[52] U.S. Cl. ................. 419/53; 419/23; 419/32; 419/48; 419/38; 419/60
[58] Field of Search ................. 419/23, 32, 38, 419/48, 53, 60

[56] References Cited

U.S. PATENT DOCUMENTS

| | | | |
|---|---|---|---|
| 3,615,382 | 8/1968 | Manilla | 75/214 |
| 4,838,935 | 6/1989 | Dunlop et al. | 75/230 |
| 5,160,534 | 11/1992 | Hiraki | 75/248 |
| 5,196,916 | 3/1993 | Ishigami et al. | 257/769 |
| 5,204,057 | 4/1993 | Ishigami et al. | 420/417 |
| 5,234,487 | 8/1993 | Wickersham, Jr. et al. | 75/248 |

FOREIGN PATENT DOCUMENTS

| | | |
|---|---|---|
| 0345045 | 12/1989 | European Pat. Off. . |
| 63-30317 | 3/1989 | Japan . |
| 02166276 | 6/1990 | Japan . |
| 03107453 | 5/1991 | Japan . |
| 03264640 | 11/1991 | Japan . |
| 04308082 | 10/1992 | Japan . |
| 04358030 | 12/1992 | Japan . |

OTHER PUBLICATIONS

M. Yamauchi and T. Kibayashi, "Development of W–Ti Binary Alloy Sputtering Target and Study of its Sputtering Characteristics", International Journal of Refractory and Hard Metals, vol. 9, No. 3, Sep. 1990 at 146.

Primary Examiner—Donald P. Walsh
Assistant Examiner—John N. Greaves
Attorney, Agent, or Firm—Finnegan, Henderson, Farabow, Garrett & Dunner

[57] ABSTRACT

A sputtering target that consists essentially of a continuous matrix of Ti-W phase, Ti phase having a particle diameter of 50 μm or less distributed in the matrix, and a W phase having a particle diameter of 20 μm or less also distributed in the matrix. Preferably the target contains aluminum in the range of 1 ppm or less. The target has high density and a low impurity content, which reduces the generation of particles from the target when it is used for sputtering. A method of manufacturing the sputtering target is also disclosed.

14 Claims, 4 Drawing Sheets

TI-W SPUTTERING TARGET AND METHOD FOR MANUFACTURING SAME

This application is a division, of application Ser. No. 08/049,409, filed Apr. 20, 1993, now abandoned.

BACKGROUND OF THE INVENTION

1. Field of the Invention

This invention relates to a Ti-W sputtering target and a method of manufacturing such a target. More particularly, the invention relates to a Ti-W sputtering target having a high density and improved properties for forming thin films for electrodes or wiring members of semiconductor devices.

2. Description of the Related Art

Sputtering is a known method suitable for forming metallic thin films for electrodes or wiring of semiconductor devices. In sputtering methods, ions are caused to collide against a target to release metal therefrom which deposits as a thin film on a substrate adjacent to the target. Therefore, the properties of the metallic film formed by sputtering greatly depend upon the characteristics of the target.

In conventional sputtering processes, particles sized from 0.7 µm to 10 µm are produced from the target and enter the thin films. The particles cause short circuits or defective wires and as a result the registration rates of the semiconductor devices are substantially decreased. The sputtering target of the invention is desirable because it does not produce such particles.

Conventional Ti-W sputtering targets are made by a powder metallurgy (P/M) method, i.e., Ti powder and W powder are mixed and then sintered to high density under specific temperature and pressure conditions.

However, a Ti-W target made by the conventional P/M method uses relatively large sized Ti and W powder particles. As a result, there is a large difference between the crystal sizes of the constituent W-phase and Ti-W phase formed by the diffusion of Ti and W (hereinafter, "Ti-W phase"). When the crystal structures of the phases are large, non-uniform quality targets tend to be formed. Large particle sizes also may not sinter to high density. Therefore, when such nonuniform quality targets are used, uniform quality thin films having uniform compositions or thickness are difficult to obtain.

Furthermore, the conventional targets have low sinterability. Thus, they have low strength, and the weak intergranular material of the target tends to be broken down by the thermal stresses created by the sputtering process. As a result, the energy of the ions produces a large number of particles. Because Ti has a very high activity, it is easily oxidized to form an oxide. The Ti oxide forms a weakly bonded portion of the metal particles in the target and voids or pores are created. The voids or pores cause an increase in the impurity gasses in the target, an increase in the porosity, and a decrease in density. As a result, the number of particles created is increased during the forming of the films by sputtering. The semiconductor devices are contaminated by the particles or impurities mixed into the metal films, and the productivity is decreased.

When carbon or oxygen are introduced into the target from the Ti or W powder, problems are created. At those portions of the target which include significant amounts of carbon, the sputtering ions are insufficiently filliped which leads to the production of particles. The metal films including large amounts of carbon are difficult to etch and are susceptible to wiring breakage. The oxygen present in the material powder causes an increase of particle production, and the oxygen present in the metal films causes an increase in electrical resistance.

Even for high density targets having a density ratio of 0.99, it was also confirmed that the number of particles generated tends to increase due to the effect of impurities, and nonusable products are likely to increase when wiring patterns are formed by etching the contaminated thin films.

SUMMARY OF THE INVENTION

It is an object of the invention to provide a Ti-W sputtering target not subject to the aforementioned problems and disadvantages. The sputtering target of the invention is suitable to make, e.g., a contact barrier layer, and can prevent the contamination of metal thin films and the generation of particles.

It is a further object of the present invention to provide a method of manufacturing the Ti-W sputtering target.

To accomplish the above described objects, a Ti-W sputtering target is provided having a matrix of a Ti-W phase. Separate portions of Ti having a diameter of 50 µm or less and separate portions of W having a diameter of 20 µm or less are distributed in the matrix.

Preferably, the Ti-W phase has a microstructure comprising Ti particles and W particles distributed in a substantially continuous matrix which consists essentially of a solid solution of Ti-W.

A method of manufacturing the Ti-W sputtering target as described above comprises the following steps.

A mixed powder is formed by mixing high purity W powder having a maximum particle diameter of 10 µm or less, at least one kind of high purity Ti powder, and high purity $TiH_2$ powder to produce a mixed powder having a Ti composition ratio of the high purity Ti powder and the high purity $TiH_2$ powder in the range of 5–20 wt. %.

The mixed powder is placed into a mold, and impurities as carbon and oxygen are reduced by heating the mold and its contents under high vacuum pressure.

The mixed powder is heated under high vacuum at 1200° C. to 1600° C. to induce diffusion of Ti and form a dense structure.

BRIEF DESCRIPTION OF THE DRAWINGS

These and other objects and advantages of the invention will become more apparent and more readily appreciated from the following detailed description of the presently preferred exemplary embodiments of the invention taken in conjunction with the accompanying drawings wherein.

DESCRIPTION OF THE PREFERRED EMBODIMENTS

The inventors found that when a Ti-W thin film was made from a Ti-W sputtering target having a metal structure comprising fine crystals, a Ti-W thin film having high purity and high uniformity of composition and thickness could be formed. In order to form the target having such fine metal structure, it was found that the target should be made from high purity, fine powders of Ti and W.

The inventors found that when W phase, Ti phase, and Ti-W phase were formed with a fine crystalline structure, and when there was a small difference between the W phase particle size and the Ti-W phase particle size, a smooth sputtered film was formed on the target surface, and smooth Ti-W thin films made from the target were formed on the substrate.

The inventors also found that in order to make a target having a fine crystalline structure, the sintering temperature should be in the range of 1200° C. to 1600° C., to prevent an increase in particle size during sintering.

The inventors determined a number of reasons for the generation of particles in the conventional Ti-W target. For example, the collapse of the eroded Ti portion or the W portion due to thermal stresses, and the collapse of the Ti phase or the Ti-W phase due to the difference in sputtering rates between the coarse Ti phase, the W phase, and the Ti-W phase. These and other reasons have been found for the generation of particles in addition to those generated by the pores in which abnormal electric discharge occurs causing an abnormal amount of particles.

The inventors have also found that the generation of particles caused by the collapse of the eroded Ti portion or the W portion due to the thermal stresses, or the collapse of the Ti-W phase caused by the difference in sputtering rates, can be substantially suppressed by forming a sputtering target having a mixed structure wherein the Ti phase and the W phase are hardly eroded by sputtering. In the mixed structure, small portions of Ti and W are distributed separately and discontinuously in a matrix of the Ti-W phase which has an interlinked structure.

The inventors also experimentally confirmed that the amount of aluminum contained in the target greatly affects the reliability of the Ti-W thin film formed by sputtering.

The inventors have also found that when a Ti-W film contact barrier layer, formed by sputtering, is located between the Si substrate surface and the Al wire layer of a diode to prevent the interdiffusion of Al and Si, the content of Al in the Ti-W target substantially influences the performance of the diode.

The inventors have also found that Al causes junction leakage and subsequent deterioration of the semiconductor device performance. This phenomenon becomes increasingly severe as the wire width of the semiconductor device decreases and the current density increases. As a result, the barrier function may be destroyed.

The contamination of the Ti-W film by aluminum is caused primarily by the aluminum leaving the mold when the target is sintered. When the target was sintered, usually a mold release agent was applied on the surface of the mold to prevent reactions between the mold and the material powders. The mold release agent included BN as a principal ingredient, with impurities such as $Al_2O_3$, etc., being present in the BN. The mold release agent on the surface of the mold is introduced into the material powders by the frictional forces acting between the mold and the powders, or by the hot pressing process. Both of these factors will increase the amount of aluminum in the material powders.

The inventors also investigated the importance of the projecting portions created in the coarse Ti-W phase, the Ti phase and the W phase, as another potential source for generating particles. When the eroded surface of a Ti-W target manufactured by a conventional method was observed using a scanning electron microscope (SEM), a large number of minute projecting portions were discovered on the surfaces of the coarse Ti-W phase, the Ti phase and the W phase. Abnormal discharges on such projecting portions generate a number of particles. Further study also revealed that the number of projecting portions is reduced when the grain diameters of the Ti phase and W phase are reduced. The inventors found that when the maximum grain diameter of the Ti phase was 50 μm or less, and the maximum grain diameter of the W phase was 20 μm or less, the generation of particles was substantially suppressed.

Based on further study for obtaining a sputtering target of high density, minute structure, and minimal aluminum content, the inventors made a number of observations. Specifically, when a mixed powder of minute Ti powder and minute W powder is placed in a mold having a partition plate, heated under high vacuum, and sintered to a high density under applied pressure to diffuse the Ti constituent into the W constituent:

(1) Al contamination is substantially prevented.

(2) The metal powders form a crystalline phase with minute grains of Ti-W referred to as the Ti-W phase.

(3) A mixed structure comprising minute Ti-W phase having an interlinked structure,, with Ti and W portions separately and discontinuously distributed in the interlinked structure can be obtained.

(4) By sintering without applied pressure, the carbon contained in the metal powder surface reacts with oxygen, and the carbon and oxygen contained in the resultant product are reduced to form CO or $CO_2$.

(5) The elimination of pores and the increase in density of the structure are promoted at a temperature in the temperature range of 1200° C. to 1600° C., and at high applied pressure.

The mixed structure should consist essentially of 5–20 wt. % Ti, 1 ppm or less of Al, and the balance W and unavoidable impurities. The amount of unavoidable impurities should be held to 0.1 ppm or less for Ni and K, 7 ppm or less for Fe, 1 ppm or less for Ni, Cu, Cr and Zr, 50 ppm or less for C, 800 ppm or less for O, 0.001 ppm or less for U, and 0.001 ppm or less for Th.

A method of manufacturing the sputtering target of the invention, having a mixed structure comprising Ti portions having a diameter of 50 μm or less, and W portions having a diameter of 20 μm or less, with both phases being separately and discontinuously dispersed in a continuous matrix consisting essentially of Ti-W phase, comprises the following steps:

I. Mixing high purity W powder having a maximum particle diameter of 10 μm or less, at least one kind of high purity Ti powder, and high purity $TiH_2$ powder, to produce a mixed powder having a ratio of high purity Ti and $TiH_2$ powder in the range Ti composition of 5–20 wt. %.

II. Placing the mixed powder in a mold, and reducing the impurities such as carbon and oxygen by heating the mold and mixed powder under a high vacuum.

III. Heating the mixed powder in the range of 1200° C. to 1600° C. under a high vacuum and under a high applied pressure to diffuse Ti and form a dense sintered structure.

Preferably, the Ti powder and TiH$_2$ powder are produced by the rotary electrode method.

In Step III, when the mixed. Ti and W powder is heated under a suitable pressure, the Ti is softened, and it diffuses and forms a substantially continuous matrix of the Ti-W phase, which is a solid solution with small quantities of another phase, believed to be Ti-W eutectic, interspersed therein.

The Ti and W which does not diffuse to form the solid solution, along with the surplus W and Ti, are distributed in the matrix in the form of particles. If the Ti-W phase does not form the interlinked matrix structure, large Ti phase and W phase having high sputtering rates are eroded earlier, and individual Ti-W phase regions tend to collapse and generate particles. Therefore, the Ti-W phase should preferably form an interlinked matrix structure.

The diameter of the Ti phase which diffuses in the matrix is 50 µm or less, preferably 30 µm or less, and more preferably 20µm or less. When the Ti phase diameter exceeds 50 µm, projecting portions form on the Ti phase during sputtering and particles are readily generated. For similar reasons, the diameter of the W phase should be 20 µm or less, and preferably 10 µm or less.

When less than 5 wt. % of elemental Ti is present in the target, large tensile stresses are generated in the metal film, and film's adhesion to the substrate is deteriorated and it is easily separated therefrom. At Ti levels of over 20 wt. %, the sheet resistance value becomes high, and such films are unsuitable for use as wiring films or contact barrier layers.

The most desirable shape of the Ti phase is a spherical configuration. This is because spherical-shaped grains have little tendency to drop out of the matrix of Ti-W phase, and angular grains readily generate particles due to abnormal discharge.

When a contact barrier layer is formed using the Ti-W target of the invention, if the impurities described below are mixed into the barrier layer, the characteristics of the semiconductor comprising the barrier layer are deteriorated. Therefore, the levels of impurities in the target should be reduced to the ranges described hereinafter.

If the amount of Al in the target exceeds 1 ppm, then the contact barrier layer formed by the target will contain excessive Al which causes connecting leakage and deterioration of the semiconductor device's reliability. The inventors have found that the amount of Al in the target should be 1 ppm or less, preferably 0.7 ppm or less, and more preferably 0.5 ppm or less. The Al content is measured by an ICP emission analysis system or by a secondary ion mass analysis system (SIMS).

Alkali metals such as Na and K readily diffuse within the SiO$_2$ film, and tend to diffuse to the interface between the Si substrate and the SiO$_2$ gate insulating film. A portion of these elements is ionized, which produces positive charges at the interface. The positive charges tend to trap charge carriers in the Si substrate, such as the charge carriers flowing in a channel between an electron source and sink. Accordingly, the content of each such alkali metal should be limited to 0.1 ppm or less, and preferably 0.05 ppm or less.

When impurities such as U and Tb are present in the contact barrier layer, they emit α-rays during radioactive decay. The α-rays induce the generation of electron-hole pairs which can cause the temporary malfunction known as a "soft error." The inventors have found that the amount of U and Tb should be limited to 5 ppm or less, and preferably 1 ppm or less.

Metal impurities such as Fe, Cr, and the like exist in higher concentrations than do Na and K, and also migrate to the interface between the Si substrate and the gate insulating layer composed of SiO$_2$. These impurities cause the generation of an interface state and fluctuation of the threshold voltage. Accordingly, the content of each such metal impurity element should be limited to 1 ppm or less, and preferably 0.5 ppm or less.

The target portions contaminated by carbon are insufficiently sputtered and remain on the eroded target surface and project therefrom. As a result, plasma-discharge becomes unstable in these portions, causing abnormal discharge and the generation of particles. When a large amount of carbon is present in the thin film, etchant tends to remain in the contaminated portions when wiring is formed in the part by etching, which creates disconnections due to faulty wiring and the presence of insulating substances. For these reasons, it is mandatory that the amount of carbon impurity is restricted to 50 ppm or less, preferably 30 ppm or less, and more preferably 15 ppm or less. The carbon content is measured by a carbon detector which uses the combustion infrared ray absorption method.

If a large amount of oxygen impurity is contained in the target, it tends to be introduced into the thin film during sputtering, and increase the electrical resistance of the thin film. To avoid such problem, the oxygen content in the target should preferably be 800 ppm or less, and more preferably 500 ppm or less. The oxygen content is measured by an oxygen analyzer which uses the inert gas melting infrared ray absorption method.

Furthermore, the inventors have determined a relationship between the density ratio of the target and the number of particles which are generated. Low density targets contain numerous pores. Consequently, abnormal discharge tends to occur in these low density portions, which causes the part to collapse and generate particles. Thus, it is desirable that the density ratio of the entire target be 99% or higher. Herein, the density ratio, d, is defined as the ratio of the density, dt, of the sintered substance as actually measured by Archimedes' method, and the calculated density, ds, of the sintered substance, i.e., d =dt/ds. The calculated density, ds, is calculated as follows:

$$\frac{100}{ds} = \frac{a}{4.51} + \frac{100-a}{19.3}$$

wherein, a=the wt. % of Ti;

4.51=the density of Ti (g/cm$^3$); and 19.3=the density of W (g/cm$^3$).

Ti powder, TiH$_2$ powder and W powder having a purity of 99.99% to 99.999% are used to produce the target of this invention.

The maximum diameter of the Ti powder and the TiH$_2$ powder is 50µm or less, preferably 30 µm or less. The average diameter of the powders is 10–25 µm, preferably 10–15 µm.

The maximum diameter of the W powder is 20 µm or less, preferably 10 µm or less. The average diameter of W is 1–10 µm, preferably 1–5 µm.

When the maximum diameter exceeds the above values, uniform, minute, mixed structures cannot be achieved and sinterability is reduced. If the average diameter is below the values described above, the surface area of the powder is increased, and the impurities on the powder surface such as oxygen, etc., are also greatly increased.

The acceptable amounts of impurities for the Ti powder and $TiH_2$ powder are as follows: Al at 10 ppm or less; Na and K at 0.1 ppm or less each; Fe, Ni and Cr at 1 ppm or less each; Cu and Zr at 10 ppm or less each; C at 50 ppm or less; $O_2$ at 1000 ppm or less; and U and Th at 0.001 ppm or less each. For W powder, the acceptable amounts of impurities are Al at 1 ppm or less; Na and K at 0.1 ppm or less; Fe, Ni and Cr at 1 ppm or less each; Cu and Zr at 1 ppm or less each; C at 50 ppm or less; $O_2$ at 300 ppm or less, and U and Th at 0.001 ppm or less each.

The inventors successfully produced high purity and minute Ti powder and $TiH_2$ powder by treating conventional Ti material using the rotary electrode method as will now be described.

In a vacuum chamber, a Ti electrode (anode) is arranged against a W electrode (cathode) in an axial direction, and the chamber is filled with helium or argon gas. The Ti electrode is rotated at a high speed. By generating arcs from the end of the W electrode to the end of Ti electrode, the Ti electrode is melted gradually. The melted Ti is then scattered by centrifugal force and cooled until it solidifies, thus forming the high purity, fine Ti powder.

When the chamber is filled with $H_2$ gas, high purity, fine $TiH_2$ powder is similarly obtained by following the method described above.

In Step I of the method, the $TiH_2$ powder is heated to 600° C. to 1000° C. to cause it to be dehydrogenated. The hydrogen which leaves the powder combines with an alkaline metal such as Na, K, or the like, or with oxygen, which are present in the mixed powder, and is exhausted out of system. Accordingly, the residual alkaline metal and oxygen in the target are vastly reduced to form a high purity target. The improvement increases as the ratio of $TiH_2$ powder to Ti powder increases. Therefore, it is most preferable to use only $TiH_2$ powder as the source of Ti.

The material powders are dry-mixed in the ratio mentioned above before they are treated by a ball mill or a V-shaped mixer. When the mixture is nonuniform, the target formed therefrom has a nonuniform structure and composition, and consequently the film characteristics are deteriorated. The powder mixing should be performed under a vacuum or in a high purity inert gas atmosphere to prevent oxygen contamination.

On an inner surface of the mixing vessel, a lining composed of high purity Ti, W or Ti-W alloy is arranged to prevent impurities from leaving the inner surface of the mixing vessel and entering the powder.

In Step II, the mixed powder prepared in Step I is heated under a high vacuum to reduce its carbon, oxygen, Na, K, etc., contents.

In Step II, the preferred mold is composed of graphite. The mold release agent BN is applied to the mold surface, and a partition plate is then placed on the surface. The mold release agent prevents adhesion between the mold and the partition plate in this step and also in Step III, which will be described below. The partition plate is placed on the mold surface to prevent direct contact between the material powders and the mold. The preferred composition of the partition plate is a refractory metal such as Mo, W, Ta, Nb, and the like, formed to a thickness of about 0.1 to 0.2 mm, to provide high temperature resistance during sintering, or alternatively a metal which has desirable manufacturability such as Ni or Ti.

The mold structure described above eliminates adhesion between the mold and the partition plate. It also effectively prevents the impurities in the mold release agent (mainly $Al_2O_3$) from entering into the mixed powder. Even if BN is used as the mold release agent, aluminum contamination is substantially prevented and the amount of aluminum in the target can be reduced to 0.2 ppm or less.

In this step, it is important that the heating temperature, holding time and the degree of vacuum are each set to appropriate values. More specifically, it is desirable to set the heating temperature in the range of from 600° C. to 1000° C. At temperatures lower than 600° C., the removal of impurities is insufficient. At temperatures higher than 1000° C., the evaporation of impurities is insufficient, thus resulting in a target containing large amounts of carbon and oxygen. Accordingly, the heating temperature is preferably in the range of from 800° C. to 900° C.

It is advantageous to set the holding time in the range of from 1 to 10 hrs, with the specific time being dependent on the heating temperature. When the holding time is less than 1 hr, the above described advantages cannot be sufficiently obtained, and when the holding time is longer than 10 hrs, productivity is reduced. In order to reduce the carbon and oxygen levels sufficiently, the vacuum within the hot press is preferably set to less than $10^{-4}$ Torr, and more preferably less than $10^{-5}$ Torr. However, if the vacuum level in the hot press is abruptly increased, the mixed powder tends to flow out of the mold. As a result, the density of the sintered substance becomes insufficient, regardless if the subsequent Step III is performed. Accordingly, it is desirable to similarly increase the degree of vacuum in the hot press until it reaches 100 Torr.

In Step III, the degassed mixed powder is heated at the temperature range of 1200° C. to 1600° C. under a high vacuum and high applied pressure to cause the elemental Ti to diffuse to the area of the elemental W and to sinter the mixed powder to a high density. In this step, it is necessary that the heating temperature, applied pressure and holding times are set to appropriate values to obtain a sintered body having a high density and a mixed structure having a fine grain size.

The applied pressure used in Step III is preferably 200 to 300 $kg/cm^2$ to promote high density in the sintered substance. When the applied pressure is lower than 200 $kg/cm^2$, the density of the resultant sintered substance will be unacceptably low, and a large number of residual pores will be present in the substance. If the applied pressure exceeds 300 $kg/cm^2$, although the density of the sintered substance will be high, the graphite mold may break. Accordingly, an applied pressure range of from 250 to 300 $kg/cm^2$ is more preferable.

As for the sintering temperature (heating temperature), T, of Step III, a temperature in the range of 1200° C. to 1600° C. is used to promote the diffusion of elemental Ti. When the sintering temperature is lower than 1200° C., the residual pores make it difficult to obtain a high density sintered substance. If the sintering temperature is higher than 1600° C., the Ti phase grows at such high temperatures and a fine grains sized structure thus cannot be obtained. Accordingly, the sintering temperature range of 1400° C. to 1500° C. is more desirable.

The holding time at the heating temperature is preferably between 1 to 8 hrs. When the holding time is less than 1 hr, numerous residual pores are present in the sintered structure, and the sintered substance will have an insufficient density. Holding times exceeding 8 hrs will not further increase the density of the sintered substance. Thus, the efficiency of manufacturing the target is reduced. It is further desirable that this step is conducted under a vacuum of $1\times10^{-4}$ Torr or less to prevent contamination by impurities and to promote degassing from the sintered body.

As a final step, the sintered dense target material is formed into the desired sized Ti-W sputtering target by grinding and polishing.

Example 1

High purity W power having a maximum particle size of 10 μm and an average particle size of 4 μm, was mixed for 48 hours with high purity Ti powder having a maximum particle size of 50 μm and an average particle size of 30 μm, in the ratio of 10 wt % Ti - 90 wt. % W, in a ball mill having a high purity argon gas atmosphere.

BN mold release agent was applied to a surface of a graphite mold, and a Ta partition plate of 0.2 mm thickness was then placed on the mold surface. The mold was then filled with the mixed power.

Next, the mold was placed in a hot press machine and the mixed power was degassed at a pressure of less than $5 \times 10^{-4}$ Torr at 900° C. for 3 hours to remove impurities.

Then, the powder was compacted and sintered for 3 hours in a hot press at a temperature of 1400° C. and at a pressure of 250 kg/cm² to form the sintered body.

The sintered body was ground, polished, and shaped by electro-discharge machining to form the Example I target of approximately 260 mm diameter and 6 mm thickness.

The impurity level of the target was analyzed and is as reported in Table 1.

Comparative Example 1

High purity W powder having a maximum particle size of 50 μm and an average particle size of 30 μm, was mixed for 48 hours with high purity Ti powder having a maximum particle size of 100 μm and an average particle size of 70 μm, in the ratio of 10 wt. % Ti - 90 wt. % W, in a ball mill having a high purity argon gas atmosphere.

BN mold release agent was applied on a surface of a graphite mold, but a Ta plate was not placed on the surface of the mold as in Example I. The mold was then filled with the mixed powder.

Next, the mold was placed in a hot press machine and the mixed power was degassed for 3 hours at a pressure less than $5 \times 10^{-4}$ Torr at 900° C. to remove impurities.

Then, the powder was compacted and sintered for 3 hours in a hot press at a temperature of 1400° C. and at a pressure of 250 kg/cm² to form a sintered body.

The sintered body was ground, polished, and shaped by electro-discharge machining to form Comparative Example 1 of approximately 260 mm diameter and 6 mm thickness.

Figure 1:
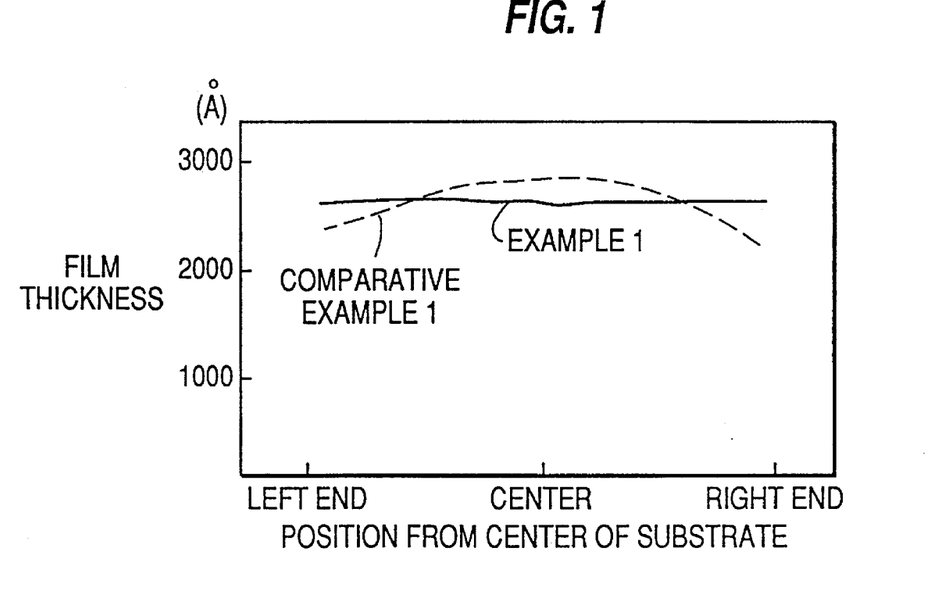
FIGS. 1 and 4 are graphs showing the thickness distribution of the films made from the targets of the example and a comparative example.
Figure 2:
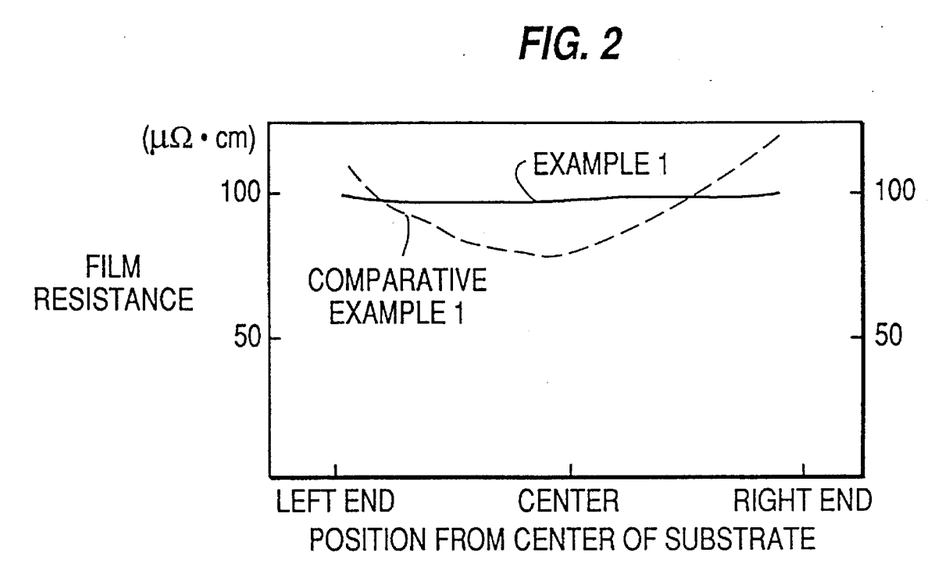
FIG. 2 is a graph showing the resistance distribution of the films made from the targets of the example and a comparative example.

The impurity level of the target was analyzed and is as reported in Table 1.

results are presented in FIG. 1 and FIG. 2.

According to the data of Table 1, the Example 1 target had a lower impurity level than the target of Comparative Example 1. The Ta plate on the surface of the example mold substantially prevented the Al compound in the mold release agent from contaminating the material powder.

The target of the present invention is very useful for forming contact barrier layers which require low levels of impurities such as Al. Accordingly, the semiconductor devices comprising contact barrier layers made from the target of the invention have high productivity and reliability.

Furthermore, the target of Example 1 had a finer structure of W phase, Ti phase and Ti-W phase than the target of Comparative Example 1 based on a microscopic analysis. The Ti-W phase was interconnected and separate portions of W and Ti were dispersed uniformly in the matrix of the Ti-W phase to form the mixed structure.

The thin films made from the target of Example 1 had uniform thickness and film resistance in the radial direction.

The number of particles in the Example 1 target was reduced in the ratio of 1/10–1/13 relative to Comparative Example 1 target.

Furthermore, when the eroded surfaces of the targets formed according to Example 1 and Comparative Example 1 were observed under an SEM, numerous projections were observed on the eroded surface of the target obtained by Comparative Example 1. However, no projections were observed on the eroded surface of the target obtained by Example 1.

Examples 2 to 3 and Comparative Examples 2 to 6

Following the conditions listed in Table 2, high purity W powders were mixed for 48 hours with high purity Ti powders in the ratio of 10 wt. % Ti - 90 wt. % W, in a ball mill having a high purity argon gas atmosphere.

BN mold release agent was applied on a surface of a graphite mold, a partition plate of 0.2 mm thickness was placed on the surface of the mold (except for in Comparative Examples 2 and 3), and the mold was filled with the mixed powder.

Next, the mold was inserted in a hot press machine and the mixed powder was degassed under a pressure of less than $5 \times 10^{-6}$ Torr to reduce impurities.

Then, the powder was placed and sintered in a hot press under the conditions listed in Table 2 to form a sintered body.

The sintered body was ground, polished, and shaped by electro-discharge machining to form a target of approximately 260 mm diameter and 6 mm thickness.

TABLE 1

| | Impurity Contents (ppm) | | | | | | | | | | | |
|---|---|---|---|---|---|---|---|---|---|---|---|---|
| | Na | K | Fe | Ni | Cu | Cr | Al | Zr | C | O | U | Th |
| Example | 0.08 | 0.07 | 0.4 | 0.6 | 0.5 | 0.3 | 0.3 | 0.2 | 40 | 600 | <0.001 | <0.001 |
| Comparative Example 1 | 0.15 | 0.07 | 1.2 | 1.1 | 1.8 | 1.10 | 15.2 | 0.3 | 40 | 700 | <0.001 | <0.001 |

The targets obtained in accordance with Example 1 and Comparative Example 1 were placed in a magnetron sputtering apparatus, and sputtering was conducted under an argon gas pressure of $2.3 \times 10^{-3}$ Torr to form a Ti-W thin film of approximately 2,000 Å thickness on a five inch Si wafer. The thickness and resistance of each film in the direction of the diameter were then measured at several locations. The The impurity contents of the targets of Examples 2 and 3 and Comparative Examples 2 and 3 were analyzed and are as listed in Table 3.

The Ti contents and densities of the targets of Examples 2 and 3 and Comparative Example 4, 5 and 6 were analyzed and are as listed in Table 4.

TABLE 2

| | Material Powder | | | | Hot Pressing Conditions | | | |
|---|---|---|---|---|---|---|---|---|
| | Element | Maximum Particle Size (μm) | Average Particle Size (μm) | Purity* | Partition Plate Composition | Sintering Temperature (°C.) | Applied Pressure (kg/cm²) | Time (hr) |
| Example 2 | Ti | 25 | 12 | 4N | Ta | 1420 | 270 | 3 |
| | W | 8 | 4 | 5N | | | | |
| Example 3 | Ti | 37 | 25 | 4N | Nb | 1420 | 290 | 3 |
| | W | 15 | 7 | 5N | | | | |
| Comparative Example 2 | Ti | 25 | 12 | 4N | None | 1420 | 270 | 3 |
| | W | 8 | 4 | 5N | | | | |
| Comparative Example 3 | Ti | 25 | 12 | 3N | None | 1420 | 270 | 3 |
| | W | 8 | 4 | 4N | | | | |
| Comparative Example 4 | Ti | 80 | 41 | 4N | Ta | 1420 | 290 | 3 |
| | W | 42 | 23 | 5N | | | | |
| Comparative Example 5 | Ti | 25 | 12 | 4N | Mo | 1280 | 270 | 3 |
| | W | 8 | 4 | 5N | | | | |
| Comparative Example 6 | Ti | 25 | 12 | 4N | W | 1420 | 160 | 3 |
| | W | 8 | 4 | 5N | | | | |

| | | Grain Sizes of Sintered Body | |
|---|---|---|---|
| | Phase | Maximum (μm) | Average (μm) |
| Example 2 | Ti | 23 | 9 |
| | W | 8 | 3 |
| Example 3 | Ti | 36 | 22 |
| | W | 15 | 6 |
| Comparative Example 2 | Ti | 23 | 9 |
| | W | 8 | 3 |
| Comparative Example 3 | Ti | 23 | 9 |
| | W | 8 | 3 |
| Comparative Example 4 | Ti | 75 | 38 |
| | W | 40 | 20 |
| Comparative Example 5 | Ti | 24 | 11 |
| | W | 7 | 3 |
| Comparative Example 6 | Ti | 24 | 11 |
| | W | 8 | 4 |

*3N = 99.9% purity
4N = 99.99% purity
5N = 99.999% purity

TABLE 3

| | Impurity Content (ppm) | | | | | | | | | | | |
|---|---|---|---|---|---|---|---|---|---|---|---|---|
| | Na | K | Fe | Ni | Cu | Cr | Al | Zr | C | O | U | Th |
| Example 2 | <0.1 | <0.1 | 0.8 | 0.3 | 0.5 | 0.4 | 0.3 | <0.1 | 35 | 720 | <0.001 | <0.001 |
| Example 3 | <0.1 | <0.1 | 0.9 | 0.4 | 0.5 | 0.4 | 0.4 | <0.1 | 35 | 490 | <0.001 | <0.001 |
| Comparative Example 2 | <0.1 | <0.1 | 1.0 | 0.5 | 0.8 | 0.4 | 5.5 | <0.1 | 50 | 680 | <0.001 | <0.001 |
| Comparative Example 3 | 2.5 | 3.0 | 72.1 | 20.6 | 11.3 | 10.2 | 61.4 | <0.1 | 45 | 1770 | <0.001 | <0.001 |

TABLE 4

| | Ti Content (wt. %) | Calculated Density (g/cm³) | Actual Density (g/cm³) | Relative density (%) |
|---|---|---|---|---|
| Example 2 | 10.1 | 14.50 | 14.80 | 102.1 |
| Example 3 | 9.5 | 14.72 | 15.00 | 101.9 |
| Comparative Example 4 | 9.8 | 14.61 | 14.39 | 98.5 |
| Comparative Example 5 | 10.5 | 14.36 | 13.24 | 92.2 |
| Comparative Example 6 | 10.3 | 14.43 | 13.97 | 96.8 |

Using the targets of Examples 2 and 3 and Comparative Example 4, Ti-W films of 3000 Å thickness were formed on substrates using conditions similar to those used in Example 1. The Ti concentration in the films and the film thickness were measured, and the results are presented in FIG. 3 and FIG. 4, respectively.

Using the targets of Examples 2 and 3 and Comparative Examples 2 and 3, a contact barrier layer (Ti-W film) was formed in each diode. The relationship between the Al content in the Ti-W contact barrier layer and the p-n junction leakage current was evaluated. A reverse bias voltage, which was initially zero and then gradually increased, was applied to each diode. The leakage current of each diode was measured until breakdown occurred. The results of this evaluation are given FIG. 5, wherein the abscissa represents the applied reverse bias voltage and the ordinate represents the measured leakage current.

Figure 3:
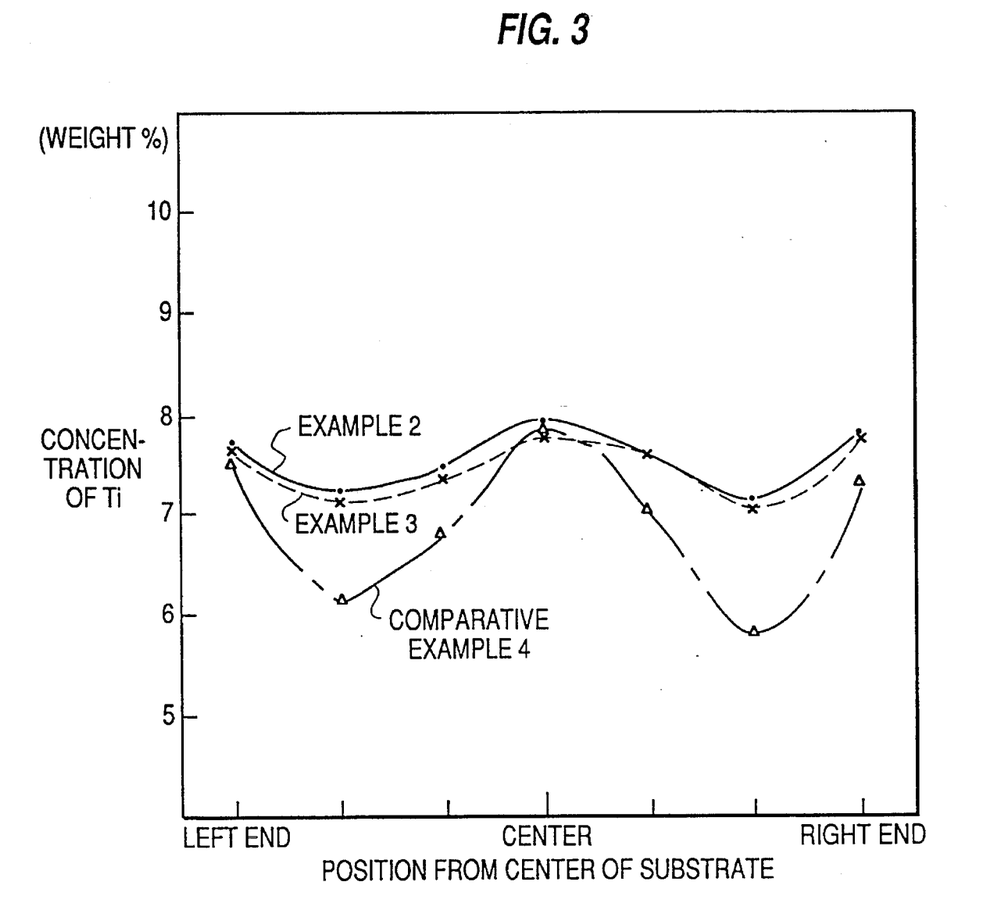
FIG. 3 is a graph showing the Ti distribution of the films made from the targets of two examples and a comparative example; and, FIG. 5 is a graph showing the leakage current characteristics of the diodes including the contact barrier layers made from the targets of the present invention.
Figure 4:
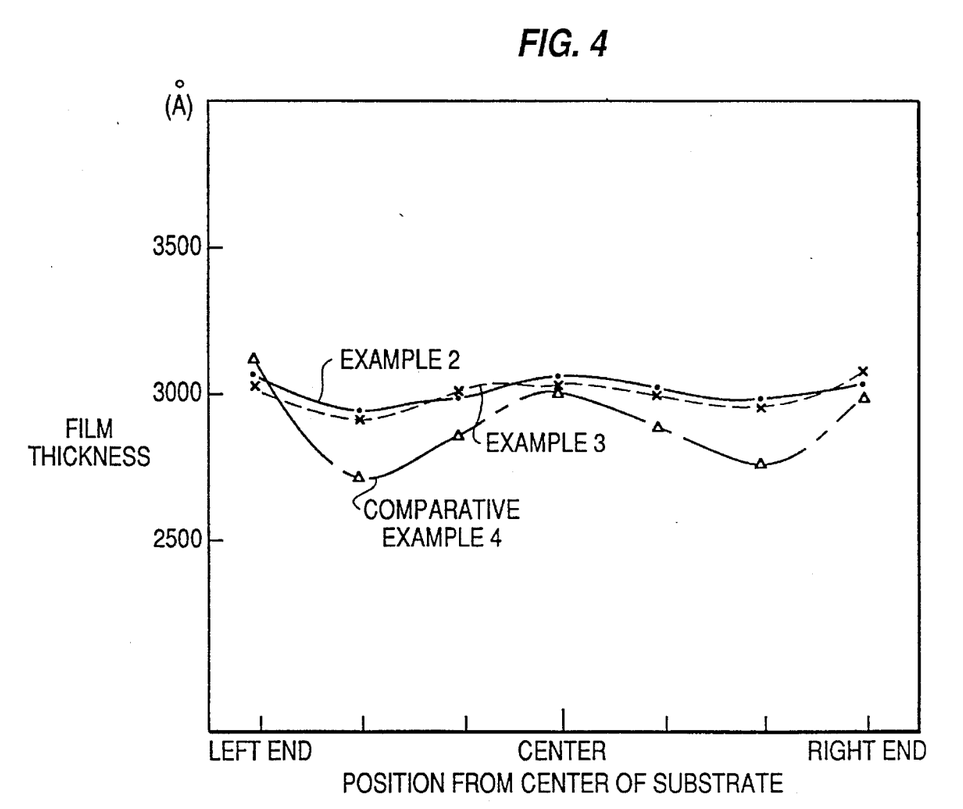
Figure 5:
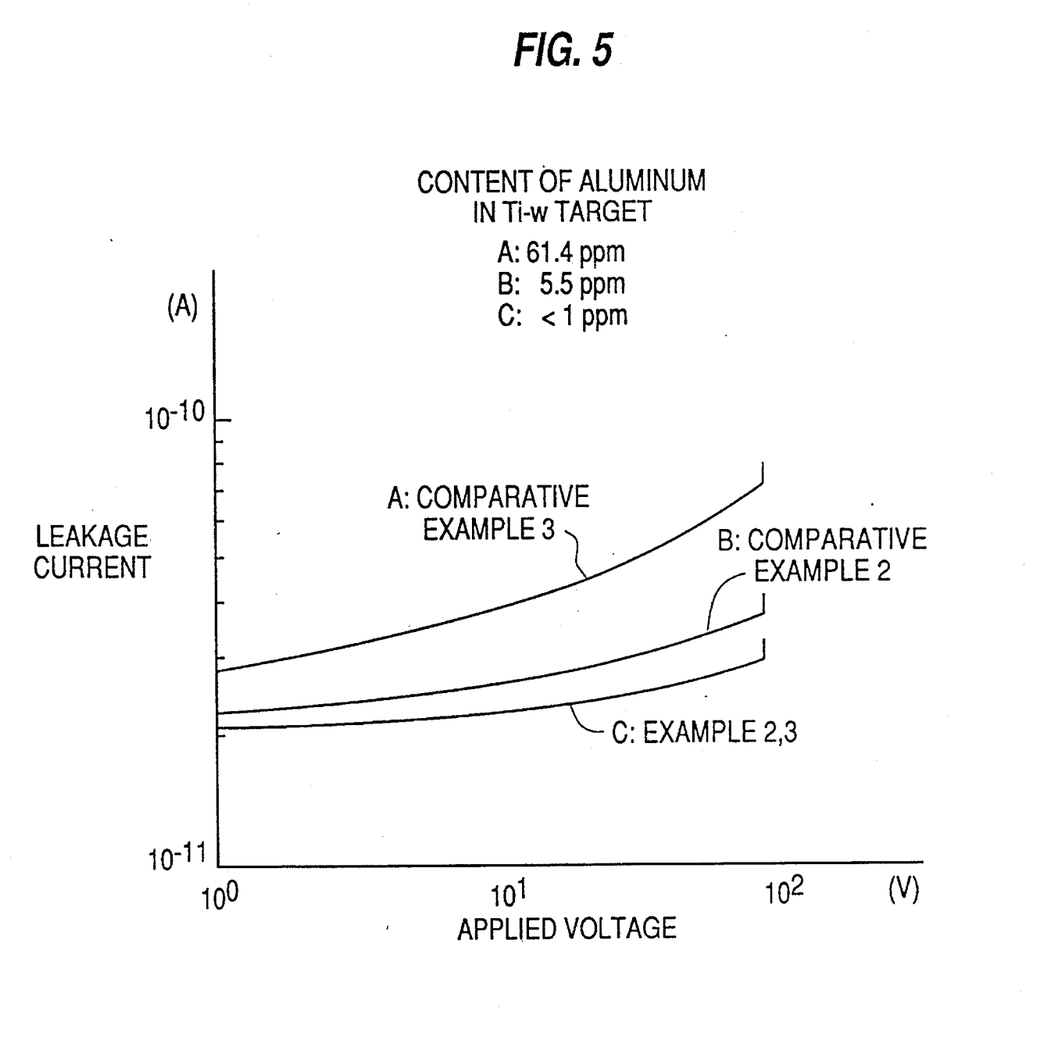

According to Tables 2 to 4 and FIGS. 3 to 5, the Ti-W sputtering targets of Examples 2 and 3 had substantially lower impurity contents. Using the targets of Examples 2 and 3, Ti-W thin films were formed which were suitable for contact barrier layers, etc., due to their low impurities.

Furthermore, the targets of the invention have a fine metallic structure, consisting of a mixed structure of a W phase and a Ti phase uniformly distributed in a continuous interlinked matrix of a Ti-W phase. The thin films formed by these targets did not have particles mixed therein. Still furthermore, FIGS. 3 and 4 verify that the Ti-W thin films had consistent composition and thickness over the entire area of the wafer.

As shown in FIG. 5, curve C, the barrier layer made from the Ti-W target of Examples 2 and 3 had an extremely low Al impurity content, and its leakage current only slightly increased when the applied voltage was increased.

On the other hand, the targets of Comparative Examples 2 and 3 were contaminated by Al compounds during sintering because a partition plate was not used in the molds. Particularly, the Comparative Example 3 target contained a large amount of Al, Fe, etc., as shown in Table 3 because low purity powder materials were used, and a partition plate was not used. Consequently, when the contact barrier layers were formed from the targets of Comparative Examples 2 and 3, the leakage current increased rapidly with increased applied voltage as shown in FIG. 5, curves B and A, respectively. This effect caused an error function in the semiconductor devices.

The results for Comparative Example 4 show that when a material powder was used comprising large particles, even if the powder had a high purity, a target having fine and uniform structure was not obtained. Using this target, many particles formed during sputtering and Ti-W films having nonuniform composition and thickness were formed on the substrate as shown in FIG. 3 and FIG. 4. The substrate was unsuitable for use in semiconductor devices.

When the sintering temperature was low as in Comparative Example 5, or the applied pressure was low as in Comparative Example 6, the resultant target had low sinterability, low density, and contained many residual pores.

The present invention has been described with respect to specific embodiments, however, the invention is not limited thereto. The scope of the invention is to be determined by the appended claims and the equivalents thereto.

What is claimed:

1. A method of manufacturing a sputtering target consisting essentially of a matrix of Ti-W phase, segregated portions of Ti having a diameter of 50 μm or less distributed in said matrix, segregated portions of W having a diameter of 20 μm or less distributed in said matrix, and 1 ppm or less Al, the method comprising the steps of:

mixing high purity W powder, at least one kind of high purity Ti powder, and high purity TiH$_2$ powder to produce a mixed powder;

placing said mixed powder in a mold with a partition plate disposed between said mold and said mixed powder, and reducing impurities in said mixed powder by heating said mold under a high vacuum; and heating the mixed powder in the range of 1200° C. to 1600° C. under vacuum and under high applied pressure to induce diffusion of Ti and to densify the mixed powder.

2. The method of claim 1, wherein the high purity W powder has a maximum particle diameter of 10 μm or less.

3. The method of claim 1, wherein the mixed powder contains 5–20 wt. % of said high purity Ti powder and high purity TiH$_2$ powder, the balance consisting of said high purity W powder and unavoidable impurities.

4. The method of claim 3, wherein said unavoidable impurities comprises:

≦0.1 ppm Na;
    ≦0.1 ppm K;
    ≦1 ppm Fe;
    ≦1 ppm Ni;
    ≦1 ppm Cu;
    ≦1 ppm Cr;
    ≦1 ppm Zr;
    ≦50 ppm C;
    ≦800 ppm O;
    ≦0.001 ppm U; and
    ≦0.001 ppm Th.

5. The method of claim 1, wherein the Ti powder and the TiH$_2$ powder are produced by a rotary electrode method.

6. The method of claim 1, wherein said partition plate is composed of at least one element selected from the group consisting of Mo, W, Ta, Nb and Ti.

7. The method of claim 1, wherein said matrix is comprised of a solid solution of Ti and W.

8. The method of claim 1, wherein the relative density ratio of the target is at least 99%.

9. The method of claim 1, wherein said target consists essentially of 5–20 wt. % Ti, 1 ppm or less Al, the balance W, and unavoidable impurities.

10. The method of claim 9, wherein said unavoidable impurities comprise:

≦0.1 ppm Na;
    ≦0.1 ppm K;
    ≦1 ppm Fe;
    ≦1 ppm Ni;
    ≦1 ppm Cu;
    ≦1 ppm Cr;
    ≦1 ppm Zr;
    ≦50 ppm C;
    ≦800 ppm O;
    ≦0.001 ppm U; and
    ≦0.001 ppm Th.

11. The method of claim 1, wherein said matrix is a continuous matrix of Ti-W phase.

12. A method of manufacturing a sputtering target consisting essentially of a matrix of Ti-W phase, segregated portions of Ti having a diameter of 50 μm or less distributed in said matrix, segregated portions of W having a diameter of 20 μm or less distributed in said matrix, the method comprising the steps of: mixing high purity W powder having a maximum particle size of 10 μm or less and at least one kind of high purity Ti powder and high purity $TiH_2$ powder to produce a mixed powder, said mixed powder containing 5–20% of said high purity Ti powder and said high purity $TiH_2$ powder, the balance W and unavoidable impurities;

placing said mixed powder in a mold with a partition plate disposed between said mold and said mixed powder, and reducing impurities in said mixed powder by heating said mold under a high vacuum; and heating the mixed powder in the range of 1200° C. to 1600° C. under vacuum and under high applied pressure to induce diffusion of Ti and to densify the mixed powder.

13. The method of claim 12, wherein said Ti powder and $TiH_2$ powder are produced by a rotary electrode method.

14. The method of claim 12, wherein said partition plate is composed of at least one of Mo, W, Ta, Nb and Ti.

* * * * *